United States Patent
Kitazawa et al.

(10) Patent No.: US 7,626,443 B2
(45) Date of Patent: Dec. 1, 2009

(54) SWITCHING CIRCUIT, SWITCHING MODULE AND METHOD OF CONTROLLING THE SWITCHING CIRCUIT

(75) Inventors: Takayaki Kitazawa, Nagano (JP); Naoyuki Miyazawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 9 days.

(21) Appl. No.: 12/068,275

(22) Filed: Feb. 5, 2008

(65) Prior Publication Data
US 2008/0136494 A1 Jun. 12, 2008

Related U.S. Application Data

(62) Division of application No. 10/648,283, filed on Aug. 27, 2003, now Pat. No. 7,352,086.

(30) Foreign Application Priority Data
Aug. 30, 2002 (JP) .............................. 2002-255057

(51) Int. Cl.
*H03K 17/00* (2006.01)
(52) U.S. Cl. .................. 327/416; 327/434; 333/101; 333/102; 333/103
(58) Field of Classification Search ................ 327/416, 327/434, 427; 333/101, 102, 103
See application file for complete search history.

(56) References Cited

U.S. PATENT DOCUMENTS

| 4,317,055 A | 2/1982 | Yoshida et al. |
| 4,719,374 A | 1/1988 | Bialo |
| 5,012,123 A | 4/1991 | Ayasli et al. |
| 5,428,303 A | 6/1995 | Pasqualini |
| 5,731,607 A | 3/1998 | Kohama |
| 6,804,502 B2 * | 10/2004 | Burgener et al. ............. 455/333 |
| 7,023,258 B2 * | 4/2006 | Hamase ..................... 327/308 |
| 7,106,121 B2 * | 9/2006 | Hidaka et al. ............... 327/308 |
| 7,173,471 B2 * | 2/2007 | Nakatsuka et al. .......... 327/308 |
| 7,492,238 B2 * | 2/2009 | Nakatsuka et al. .......... 333/103 |
| 2003/0016082 A1 | 1/2003 | Matsunaga et al. |

FOREIGN PATENT DOCUMENTS

| JP | 58-93042 | 6/1983 |
| JP | 63-142716 | 6/1988 |
| JP | 5-315920 | 11/1993 |
| JP | 9-270659 | 10/1997 |
| JP | 2000-223902 | 8/2000 |
| JP | 2002-223902 | 8/2000 |
| JP | 2002-135095 | 5/2002 |

* cited by examiner

*Primary Examiner*—Kenneth B. Wells
(74) *Attorney, Agent, or Firm*—Westerman, Hattori, Daniels & Adrian, LLP

(57) ABSTRACT

A switching circuit includes switching transistors connected to one of an input terminal and an output terminal of the switching circuit, and a control bias supply circuit that supplies a control bias for cutting off all the switching transistors to the switching transistors when all of the switching transistors are in a non-selected state.

2 Claims, 8 Drawing Sheets

SWITCHING CIRCUIT, SWITCHING MODULE AND METHOD OF CONTROLLING THE SWITCHING CIRCUIT

This application is a divisional application of U.S. Ser. No. 10/648,283, filed Aug. 27, 2003, now U.S. Pat. No. 7,352,086, which claims priority of Japanese Patent Application No. 2002-255057, filed on Aug. 30, 2002, which are hereby incorporated by reference in its entirety.

BACKGROUND OF THE INVENTION

1. Field of the Invention

The present invention relates to a switching circuit, a switching module and a method of controlling the switching circuit.

2. Description of the Related Art

FIG. 1 shows a circuit structure of a conventional semiconductor switch 100. As shown in FIG. 1, the conventional semiconductor switch 100 has a structure such that a high-frequency input signal supplied through an input terminal Tin is selectively outputted from one of a plurality of output terminals (T.sub.out1, T.sub.out2). In FIG. 1, the semiconductor switch 100 adopts an SPDT (single pole double throw) arrangement.

The semiconductor switch 100 may be applied to, for example, an arrangement in which an antenna is shared by a transmission circuit and a reception circuit. The switch 100 cuts off electrical connection between the antenna and one of the two circuits while the other circuit is using the antenna.

A source voltage Vs of a non-selected switching transistor (Tr1/Tr2) depends on the potential of the source of a selected switching transistor (Tr2/Tr1) defined by applying a voltage to the gate of the selected transistor. Therefore, a potential difference is produced between the gate and source of the non-selected switching transistor (Tr1/Tr2), and maintains the non-selected switching transistor (Tr1/Tr2) in the cutoff (OFF) state.

When all output terminals (T.sub.out1, T.sub.out2) are cut off in the above-mentioned configuration, it is impossible to set the source voltage Vs at a prescribed level because there are no switching transistors in the selected state. This leads to a problem that the switching transistors cannot be fully cut off.

FIG. 2 shows another conventional switching circuit 200 in which a bias voltage Vba is constantly supplied to the sources of the transistors Tr1 and Tr2 via a resistor R5. The bias voltage Vba sets the potential difference between the gate and the source of the switching transistors (Tr1, Tr2) at a prescribed level. Japanese Laid-Open Patent Application No. 2000-223902 discloses a technique for solving the same problem as described above.

However, the above-mentioned conventional techniques are intended to merely keep the source voltage Vs of the non-selected switching transistor at a prescribed level when any of the switching transistors is in the selected state. Therefore, when all the switching transistors are in the non-selected state, these transistors cannot be fully cut off.

SUMMARY OF THE INVENTION

It is an object of the present invention to provide a switching circuit, a switching module and a method of controlling the switching circuit in which the above-mentioned disadvantages are eliminated.

A more specific object of the present invention is to provide a switching circuit, a switching module and a method of control the switching circuit capable of surely cutting off all switching transistors when all of the switching transistors are non-selected.

The above objects of the present invention are achieved by a switching circuit including: switching transistors connected to one of an input terminal and an output terminal of the switching circuit; and a control bias supply circuit that supplies a control bias for cutting off all the switching transistors to the switching transistors when all of the switching transistors are in a non-selected state.

The above objects of the present invention are also achieved by a switching module comprising: a switching circuit including switching transistors connected to one of an input terminal and an output terminal of the switching circuit, and a control bias supply circuit that supplies a control bias for cutting off all the switching transistors when all of the switching transistors are in a non-selected state; and a decoding circuit that decodes a data signal inputted from an outside of the switching module and produces a voltage signal and/or a selection control signal for operating the switching circuit.

The above objects of the present invention are also achieved by a method of controlling a switching circuit including switching transistors commonly connected to one of an input terminal and an output terminal of the switching circuit, comprising a step of: supplying a control bias for cutting off all the switching transistors to the switching transistors when all the switching transistors are in a non-selected state.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
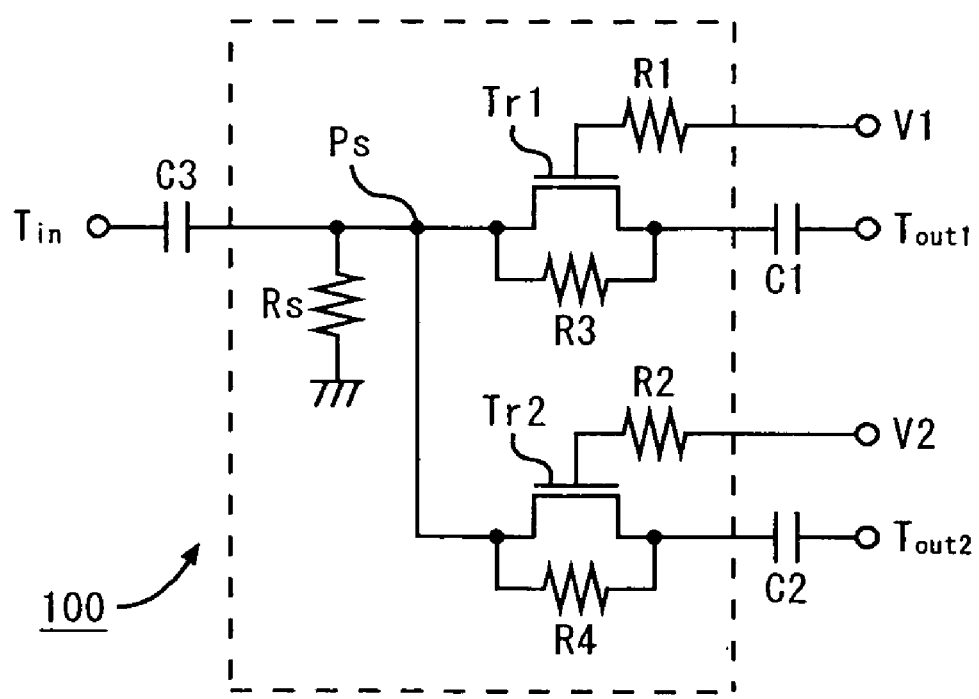
FIG. 1 is a circuit diagram of a conventional switching circuit.
Figure 2:
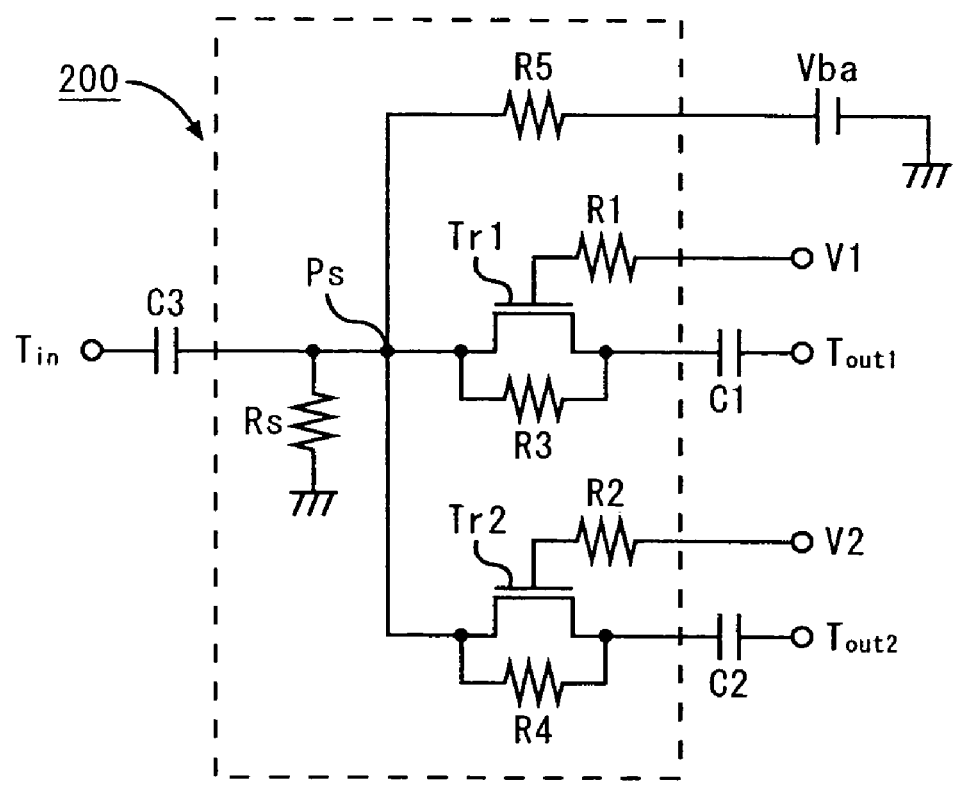
FIG. 2 is a circuit diagram of another conventional switching circuit.

Referring now to the drawings, a description of preferred embodiments of the present invention will be given in detail.

First Embodiment

A first embodiment of the present invention will now be described. The present embodiment is a switching circuit having a plurality of switching transistors that are commonly connected to either an input terminal or an output terminal of the switching circuit. All switching transistors that are non-selected are selectively supplied with a control bias for cutting off these transistors. The bias voltage securely and fully cuts off the non-selected transistors. When any of the switching transistors is being selected, a voltage is applied to the source of the remaining non-selected transistor(s) via the selected switching transistor, so that there is no need to supply the control bias to the transistors. This contributes to power saving.

Figure 3:
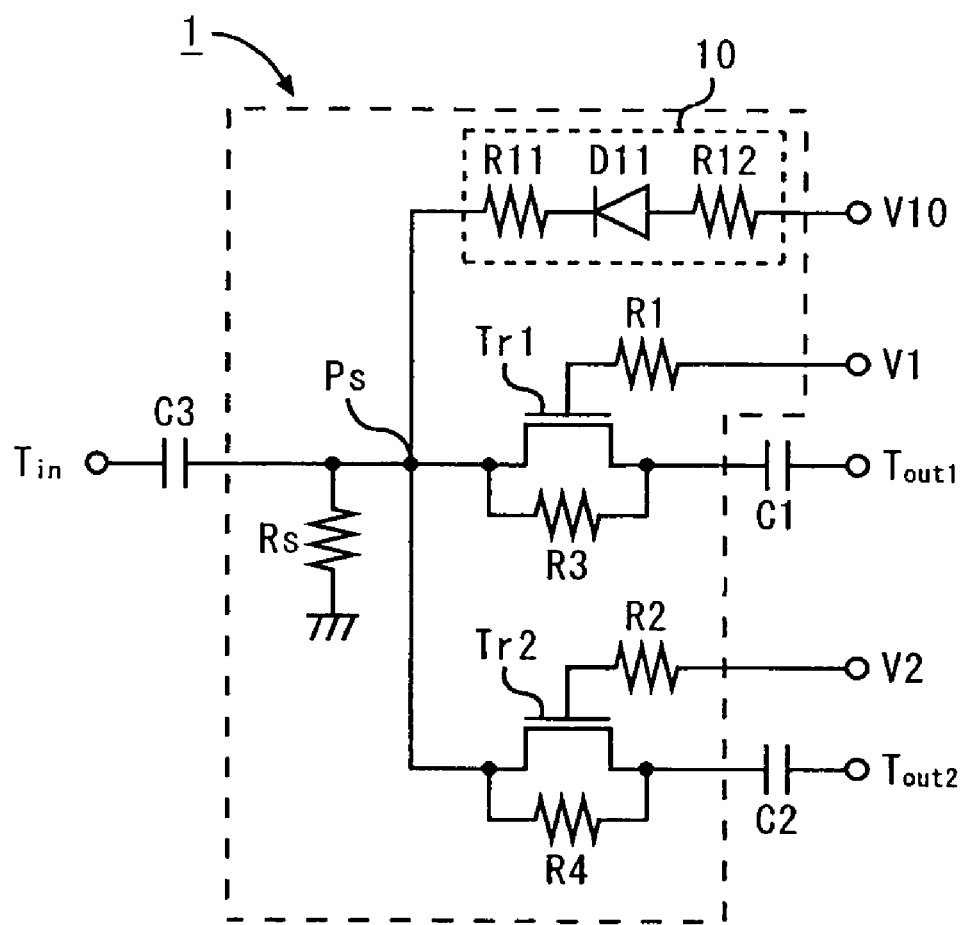
FIG. 3 is a circuit diagram of a switching circuit according to a first embodiment of the present invention.

In the following, the structure and operation of the present embodiment will be described in more detail referring to the drawings. FIG. 3 is a circuit diagram showing a structure of a switching circuit 1 according to the present embodiment.

As shown in FIG. 3, the switching circuit 1 adopts an SPDT switch structure, which is a one-input-two-output structure having two switching transistors Tr1 and Tr2. For example, the switching transistors Tr1 and Tr2 may be MESFETs (metal semiconductor field effect transistors) formed by gallium arsenide (GaAs). Furthermore, the switching transistors Tr1 and Tr2 may also be HEMTs (high electron mobility transistors).

A selection control signal V1 is applied to a gate of the switching transistor Tr1 through a resistor R1, which serves to attenuate a high-frequency signal propagated through an input terminal $T_{in}$. A drain of the switching transistor Tr1 is connected to an output terminal $T_{out1}$ through a capacitor C1, which serves as a capacitive element for shutting off the DC component of the high-frequency signal. A source of the switching transistor Tr1 is connected to the input terminal $T_{in}$ through a capacitor C3, which serves to shut off the DC component of the high-frequency signal. Likewise, in terms of the switching transistor Tr2, a selection control signal V2 is applied to a gate of the switching transistor Tr2 through a resistor R2, which serves to attenuate the DC component of the high-frequency signal propagated through the input terminal $T_{in}$. A drain of the switching transistor Tr2 is connected to the output terminal $T_{out2}$ through a capacitor C2, which serves as a capacitive element for shutting off the DC component of the high-frequency signal. A source of the switching transistor Tr2 is connected to the input terminal $T_{in}$ through the capacitor C3, which serves to shut off the DC components of the high-frequency signal. The input terminal $T_{in}$ is supplied with, for example, a high-frequency signal received by an antenna. The capacitors C1, C2 and C3 for shutting off the DC component of the high-frequency signal received through the antenna may be incorporated to the structure of the switching circuit 1 or to other structure(s). The following description refers to the latter case where the capacitors are incorporated to other structure(s).

The source and the drain of the switching transistor Tr1 and the switching transistor Tr2 are connected through a ballast resistor R3 and a ballast resistor R4, respectively. The ballast resistors R3 and R4 are provided to standardize the potential between the source and the drain of the switching transistor. In other words, the ballast resistor is provided to practically eradicate a possible potential difference between the source and the drain. In this embodiment, the resistance used in the ballast resistors R3 and R4 is approximately 10 kOhm.

In the above structure, the source of each of the switching transistors Tr1 and Tr2 is connected to the capacitor C3 through a common connection node Ps. This connection node Ps is grounded through a resistor Rs. Moreover, the connection node Ps is also connected to a control bias supply circuit 10. Through the connection node Ps, a control bias is supplied from the control bias supply circuit 10 to the sources of the switching transistors Tr1 and Tr2.

Now, a structure of the control bias supply circuit 10 of the present embodiment will be described. As shown in FIG. 3, the control bias supply circuit 10 has a structure in which a diode D11 is connected between two resistors R11 and R12 in series, and a voltage signal V10 is applied to this structure to generate the control bias. The diode D11 is connected so that it can be forwardly driven by the voltage signal V10 for biasing.

The control bias supply circuit 10 that selectively supplies the control bias to the node Ps. More particularly, the control bias supply circuit 10 supplies the control bias for cutting off all the transistors Tr1 and Tr2 to the node Ps when both switching transistors Tr1 and Tr2 are non-selected. The control bias supply circuit 10 has the diode D11 connected in the forward direction in which the voltage V10 is applied. When one of the outputs (switching transistors) is selected, the diode D11 prevents current caused by an increased potential of the node Ps defined by the selection control signal applied to the gate of the selected switching transistor to flow back to the control bias supply circuit 10.

The voltage signal V10 applied to the control bias supply circuit 10 is produced by a decoder 11 (FIG. 4), which is provided outside the switching circuit 1 and decodes a data signal inputted from an outside CPU. Here, for example, the data signal can be a two-bit data (for the SPDT switch). The data signal includes data indicating that one of the switching transistors Tr1 and Tr2 is to be selected, i.e. one of the outputs is to be obtained, or both switching transistors Tr1 and Tr2 are to be non-selected, i.e. the control bias is to be supplied. Accordingly, when the data signal indicates that both the switching transistors Tr1 and Tr2 should be non-selected, i.e. the control bias should be supplied, the decoder 11 produces the voltage signal V10 by decoding the data signal and applies this voltage signal V10 to the control bias supply circuit 10. Then the control bias supply circuit 10 converts the applied voltage signal V10 into the control bias by the combination of the resistors R11, R12 and diode D11. The control bias thus produced is supplied to the connection node Ps. In this way, the gate and the source of the switching transistors Tr1 and Tr2 are reversely biased, so that the switching transistors Tr1 and Tr2 can be completely cut off.

Figure 4:
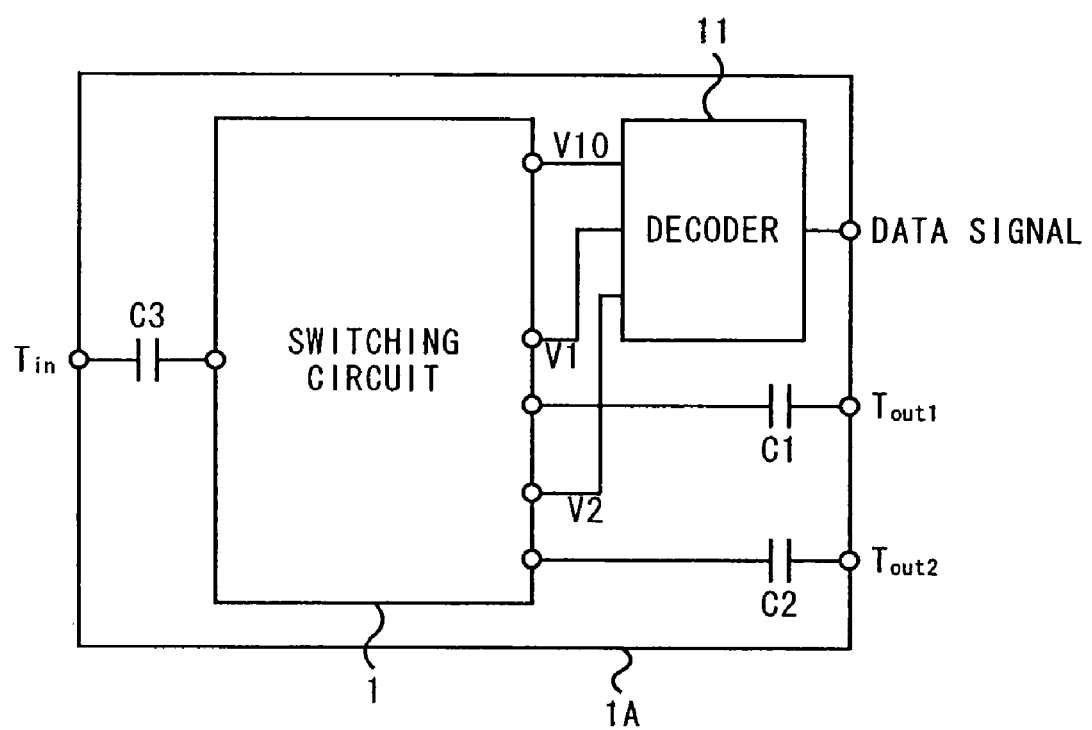
FIG. 4 is a block diagram of a switching module in which the switching circuit shown in FIG. 3 is incorporated.

The switching circuit 1 with the structure described above can be integrated to provide a single chip as shown in FIG. 4. Furthermore, the switching circuit 1 formed as a single chip can be combined with other circuits (e.g. the decoder 11, etc.) to provide a single switching module 1A. The capacitors C1, C2 and C3 can be disposed inside the switching module 1A as shown in FIG. 4. Alternatively, the capacitors C1, C2 and C3 may be provided, as external components, outside the switching module 1A and may be externally connected to the output terminals Tout1 and Tout2 and the input terminal Tin.

Furthermore, the decoder 11 may be incorporated in the chip of the switching circuit 1. In this way, the switching operation of the present embodiment can be realized all together within a single chip.

Although the SPDT switch with one input and two outputs has been described as one example of the present invention, the present invention is not limited thereto. For example, it is possible to employ a one-input-one-output structure, a two-input-three-output structure, or even other structures depending on the objective.

Second Embodiment

Next, a second embodiment of the present invention will be described in detail with reference to FIG. 5. The embodiment will show another example of the control bias supply circuit.

Figure 5:
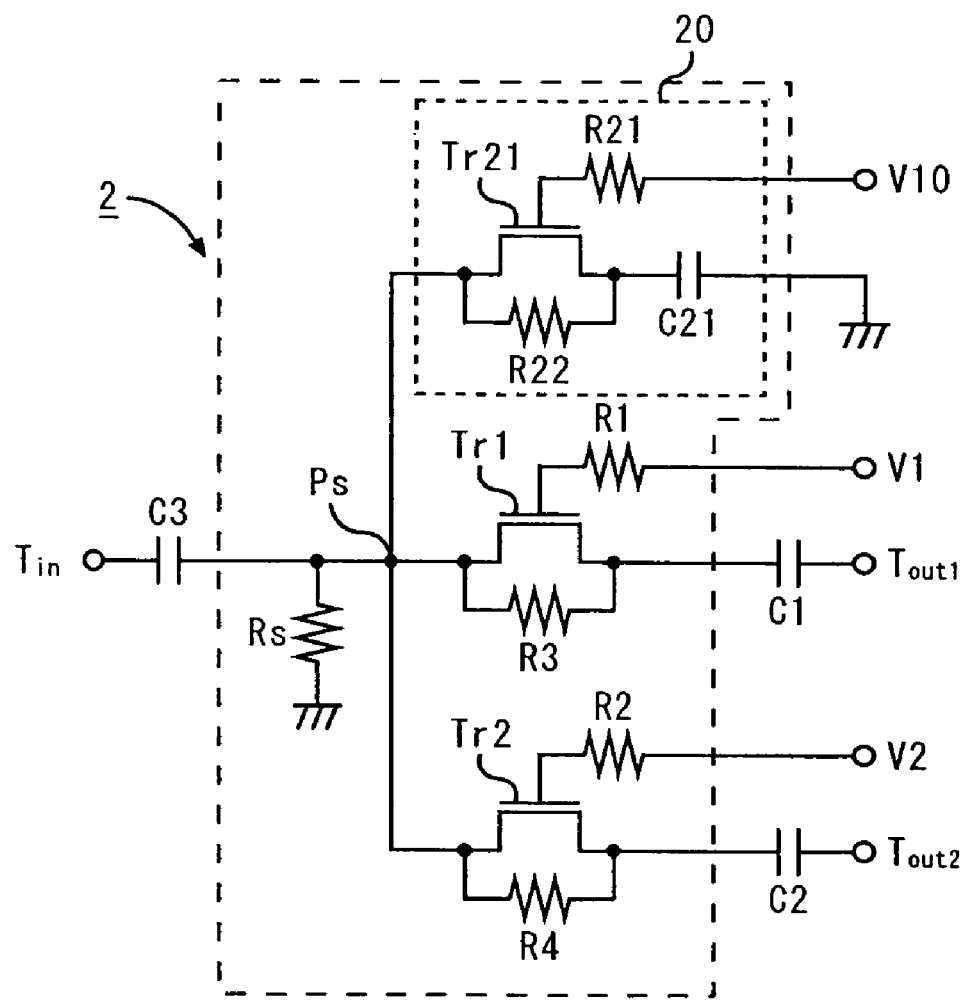
FIG. 5 is a circuit diagram of a switching circuit according to a second embodiment of the present invention.

FIG. 5 is a circuit diagram illustrating a structure of a switching circuit 2 having a control bias supply circuit 20 according to the second embodiment of the present invention.

As can be seen in FIG. 5, the control bias supply circuit 20 includes a bias transistor Tr21, and a source of this bias transistor Tr21 is connected to the connection node Ps. The voltage signal V10 is applied to a gate of the bias transistor Tr21 through a resistor R21, which is provided to attenuate a high-frequency signal received via an input terminal T.sub.in. In this embodiment, the bias transistor Tr21 is constructed by a MESFET.

In the above structure, when both the switching transistors Tr1 and Tr2 are non-selected, the voltage signal V10 is applied to the gate of the voltage transistor Tr21, which then produces the control bias (e.g. the potential difference between the gate and the source). The control bias thus produced is supplied to sources of switching transistors Tr1 and Tr2 through the connection node Ps. In this way, the gates and the sources of the switching transistors Tr1 and Tr2 are reversely biased, and are completely cut off.

Furthermore, as illustrated in FIG. 5, the drain of the bias transistor Tr21 may be grounded through a capacitor C21, which is a capacitive element. The capacitor C21 enhances isolation between the input terminal T.sub.in and output terminals T.sub.out1 and T.sub.out2, and contributes to realizing the cutoff state more surely. More particularly, the drain of the bias transistor Tr21 is grounded via the capacitor C21 for shutting off the DC component of the high-frequency signal. Thus, the transistor Tr21 functions as a shunt transistor for the high-frequency signal when the switching transistors Tr1 and Tr2 are in the non-selected state. Accordingly, isolation between the input terminal Tin and the output terminals T.sub.out1 and T.sub.out2 can be enhanced, and the non-selected switching transistors can be cut off more surely. The rest of the structure of this embodiment is similar to the first embodiment, and therefore, a description thereof will be omitted.

Third Embodiment

Next, a third embodiment of the present invention will be described with reference to the drawings. This embodiment employs a structure in which the voltage value of the control bias is made variable.

Figure 6:
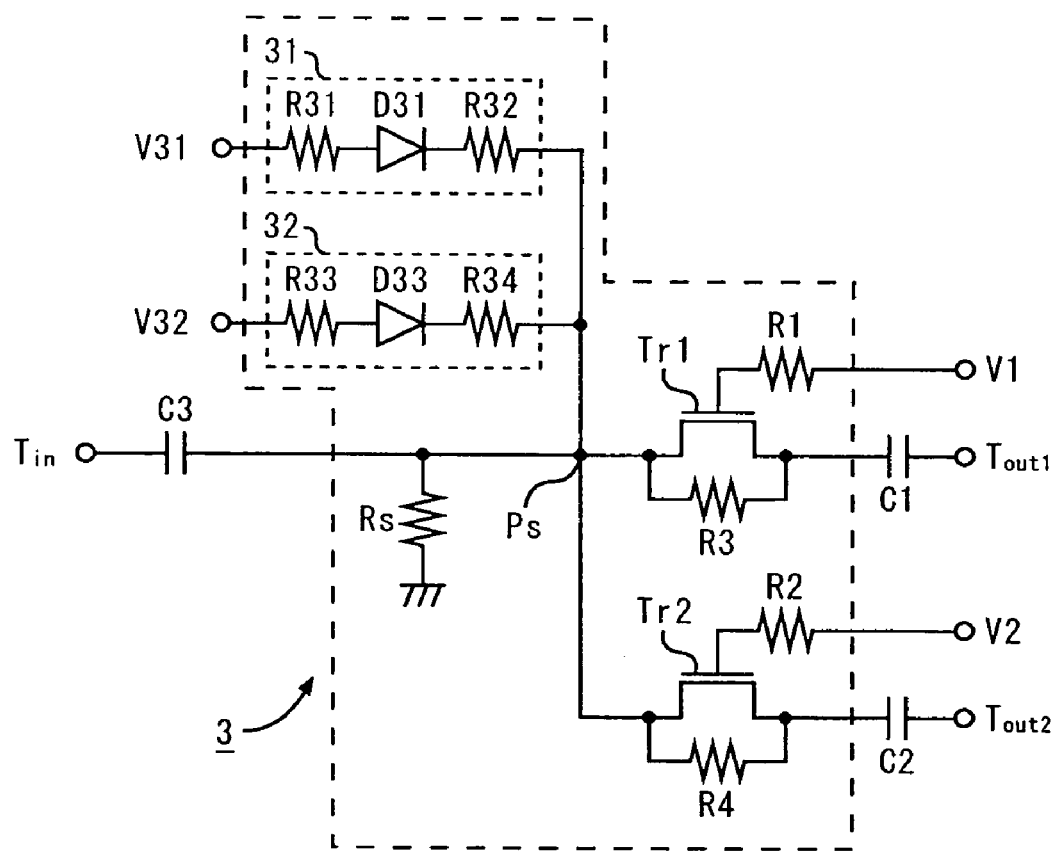
FIG. 6 is a circuit diagram of a switching circuit according to a third embodiment of the present invention.

FIG. 6 is a circuit diagram showing a structure of a switching circuit 3, which includes control bias supply circuits 31 and 32. The present embodiment is a variation of the switching circuit 1 of the first embodiment, and it is an example in which the voltage value of the control bias is made variable.

As can be seen in FIG. 6, the switching circuit 3 includes a plurality of control bias supply circuits 31 and 32 (in this embodiment, the switching circuit includes two control bias supply circuits). In this embodiment, either one of the control bias supply circuits 31 and 32 is set up for use based on a data signal inputted from the outside of the switching circuit 3, and therefore, it is possible to appropriately switch the control bias to be supplied to sources of switching transistors Tr1 and Tr2. For instance, this setting can be realized by adding a one-bit flag to the data signal.

Figure 7:
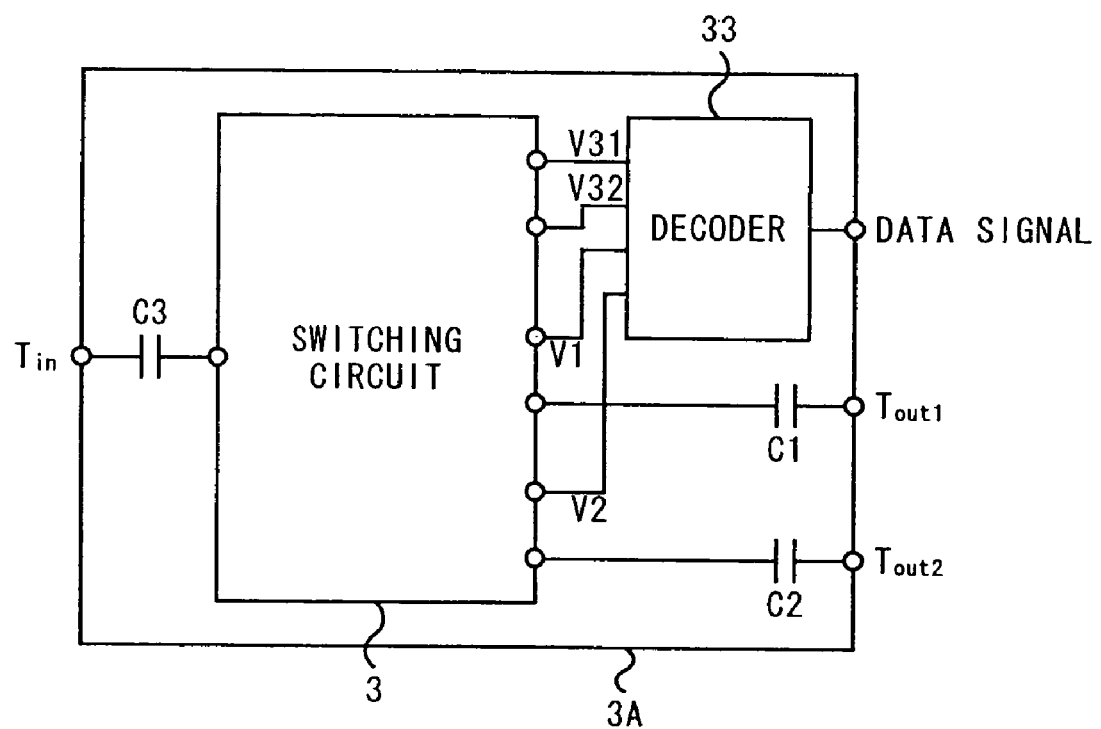
FIG. 7 is a block diagram of a switching module in which the switching circuit shown in FIG. 6 is incorporated.

FIG. 7 shows a structure in which the switching circuit 3 of the present embodiment is made as a single chip. A switching module 3A as illustrated in FIG. 7 has a similar structure to the switching module 1A as described with respect to the first embodiment except that a decoder 33 will output either a voltage signal V31 or a voltage signal V32 depending on the data signal when all the switching transistors Tr1 and Tr2 are non-selected. With this structure, each of the control bias supply circuits 31 and 32, to which the voltage signals V31 and V32 are selectively applied, supplies the respective control bias to the sources of the switching transistors Tr1 and Tr2 through the connection node Ps. The rest of the structure of this embodiment is similar to the first embodiment, and therefore, a description thereof will be omitted.

The switching circuit 3 has the two control bias supply circuits 31 and 32, but the present invention is not limited thereto. The switching circuit may have three or more control bias supply circuits. In this case, the number of bits to be added to the data signal for selecting any one of the multiple control bias supply circuits should be determined depending on the number of the control bias supply circuits.

Furthermore, although the present embodiment has been described in terms of a case in which the control bias is switched when all of the switching transistors Tr1 and Tr2 are non-selected, the present invention is not limited to such case. The control bias may be switched even when one of the switching transistors is selected, depending on the situation and objective. It is even possible to switch the control bias when all the switching transistors Tr1 and Tr2 are non-selected or when one of the switching transistors is selected. In this way, the present embodiment exhibits improved circuit controllability, especially because desired control bias can be applied depending on each particular event.

Fourth Embodiment

Next, a fourth embodiment of the present invention will be described with reference to FIG. 8. This embodiment will show an example in which the switching circuit includes switching transistors with shunt circuits.

Figure 8:
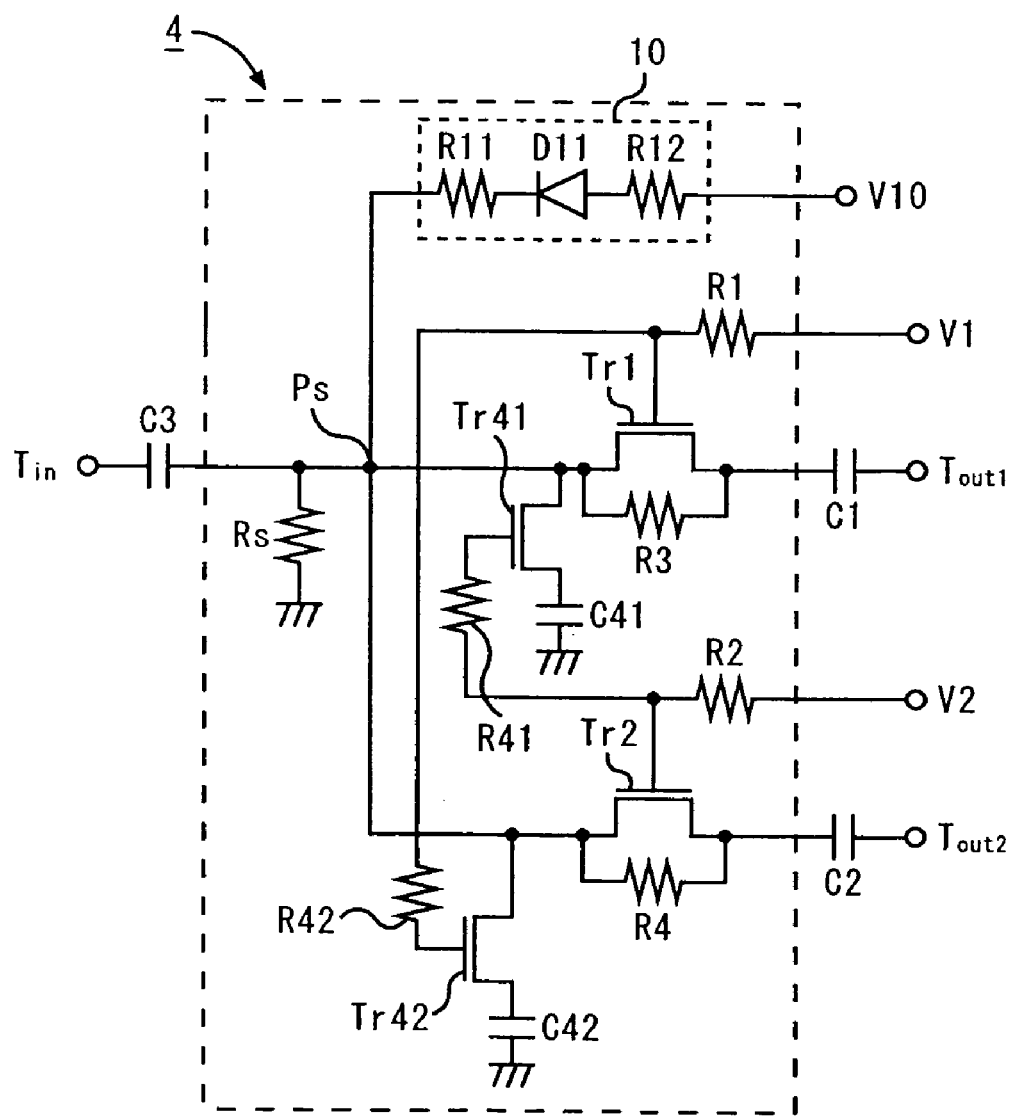
FIG. 8 is a circuit diagram of a switching circuit according to a fourth embodiment of the present invention.

FIG. 8 is a circuit diagram showing a switching circuit 4 of the present embodiment. As illustrated in FIG. 8, shunt transistors Tr41 and Tr42 are connected to sources of switching transistors Tr1 and Tr2, respectively.

A selection control signal V2 is applied to a gate of the shunt transistor Tr41 through a resistor R41 and a resistor R2 provided for attenuating the high-frequency input signal, and a drain of the shunt transistor Tr41 is grounded through a capacitor C41, which is a capacitive element for shutting off the DC component of the high-frequency signal. Likewise, a selection control signal V1 is applied to a gate of the shunt transistor Tr42 through a resistor R42 and a resistor R1 provided for attenuating the high-frequency signal, and a drain of the shunt transistor Tr42 is grounded through a capacitor C42, which is an element for shutting off the DC component of the high-frequency signal.

Accordingly, in accordance with the present embodiment, the shunt transistor Tr41 will short-circuit the source of the switching transistor Tr1 when the switching transistor Tr1 is non-selected and the switching transistor Tr2 is being selected. Furthermore, the shunt transistor Tr42 will ground the source of the switching transistor Tr2 when the switching transistor Tr2 is non-selected and the switching transistor Tr1 is selected. In this way, isolation between the input terminal Tin and the output terminals T.sub.out1 and T.sub.out2 can be enhanced, and the non-selected switching transistor can be cut off more surely. The rest of the structure of this embodiment is similar to the first embodiment, and therefore, a description thereof will be omitted.

As described above, the present invention realizes a switching circuit which is capable of completely and accurately cutting off switching transistors when all of the switching transistors are in the non-selected state. Furthermore, the present invention is capable of preventing the potential of the node Ps defined by the gate potential of the selected switching transistor from causing current to flow back to the control bias supply circuit. Still more, the present invention exhibits improved circuit controllability because the control bias can be varied depending on each particular event. The present invention also proposes a switching module that includes the switching circuit, and a method for controlling such switching circuit.

While the preferred embodiments of the invention has been described using specific terms, such description is for illustrative purposes only, and it is to be understood that changes and variations may be made without departing from the spirit or the scope of the following claims.

The present application is based on Japanese Patent Application No. 2002-255057 filed on Aug. 30, 2002, the entire disclosure of which is hereby incorporated by reference.

We claim:

1. A switching circuit comprising:
   a switching circuit including switching transistors commonly connected to a connection node used as one of a frequency signal input terminal and a frequency signal output terminal of the switching circuit,
   a control bias supply circuit that supplied a control bias for cutting off all the switching transistors to one of a source and a drain of each of the switching transistors in order to prevent the high frequency signal from substantially propagating through all the switching transistors when all of the switching transistors are in a non-selected state in which all the switching transistors are turned OFF in response to selection control signals applied to gates of all the switching transistors; and
   a decoding circuit that decodes a data signal inputted from an outside of the switching module and produces the selection control signals,
   wherein the control bias supply circuit comprises a diode having an anode to which a voltage signals is applied from outside of the switching circuit, and having a cathode via which the control bias is output in accordance with the voltage signal.

2. The switch module as claimed in claim 1, wherein the switching circuit and the decoding circuit are formed on a single chip.

\* \* \* \* \*

UNITED STATES PATENT AND TRADEMARK OFFICE
CERTIFICATE OF CORRECTION

PATENT NO. : 7,626,443 B2
APPLICATION NO. : 12/068275
DATED : December 1, 2009
INVENTOR(S) : Takayuki Kitazawa et al.

It is certified that error appears in the above-identified patent and that said Letters Patent is hereby corrected as shown below:

On the Title page:
In Item 75 the Inventor, change "Takayaki Kitazawa" to be -- Takayuki Kitazawa --

Signed and Sealed this

Twenty-seventh Day of April, 2010

David J. Kappos
*Director of the United States Patent and Trademark Office*